(12) United States Patent
Kagawa et al.

(10) Patent No.: US 6,911,107 B2
(45) Date of Patent: Jun. 28, 2005

(54) PIEZOELECTRIC FILM TYPE ACTUATOR, LIQUID DISCHARGE HEAD, AND METHOD OF MANUFACTURING THE SAME

(75) Inventors: Yutaka Kagawa, Tokyo (JP); Akira Unno, Kanagawa (JP); Tetsuro Fukui, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 239 days.

(21) Appl. No.: 09/977,972

(22) Filed: Oct. 17, 2001

(65) Prior Publication Data

US 2002/0066524 A1 Jun. 6, 2002

(30) Foreign Application Priority Data

Oct. 19, 2000 (JP) .......................................... 2000/319381

(51) Int. Cl.[7] .......................... B32B 31/20; H05K 3/12; H01L 21/30; B41J 2/02; B41J 2/045
(52) U.S. Cl. .................... 156/230; 156/247; 156/272.2; 156/289; 156/89.12; 427/147; 428/914; 438/458; 438/584; 347/47; 347/70
(58) Field of Search ................................ 156/230, 233, 156/240, 247, 272.2, 289, 89.11, 89.12, 89.22; 427/146, 147, 148, 96, 123; 428/195, 202, 208, 914; 438/455, 458, 584; 347/68, 70, 44, 47

(56) References Cited

U.S. PATENT DOCUMENTS 5,466,631 A * 11/1995 Ichikawa et al. ........... 438/406
6,013,567 A * 1/2000 Henley et al. ............... 438/515
6,013,970 A * 1/2000 Nishiwaki et al. .......... 310/330
6,071,795 A * 6/2000 Cheung et al. ............. 438/458
6,335,263 B1 * 1/2002 Cheung et al. ............. 438/455
6,347,862 B1 * 2/2002 Kanno et al. ................. 347/68

FOREIGN PATENT DOCUMENTS

JP  62-213399      9/1987
JP  06-320739    * 11/1994 .............. B41J/2/16

OTHER PUBLICATIONS

R. Herino et al. "Microstructure of Porous Silicon and its Evaluation with Temperature", *Mater. Lett.*, vol. 2(6A & B), pp. 519–523 (1984).

* cited by examiner

Primary Examiner—Linda Gray
(74) Attorney, Agent, or Firm—Fitzpatrick, Cella, Harper & Scinto (57) ABSTRACT

A method for manufacturing a piezoelectric film type actuator, which is provided with a piezoelectric film and an oscillating plate structural member bonded therefor, comprises the steps of forming a piezoelectric film on an intermediate transfer member; bonding the piezoelectric film on the intermediate member and the oscillating plate structural member; and peeling off the intermediate transfer member from the piezoelectric film. Through the steps thus arranged, it becomes possible to enhance the bonding strength and durability of the piezoelectric film and the oscillating plate structural member without using a bonding agent in the manufacture of a highly reliable piezoelectric film type actuator.

33 Claims, 6 Drawing Sheets

PIEZOELECTRIC FILM TYPE ACTUATOR, LIQUID DISCHARGE HEAD, AND METHOD OF MANUFACTURING THE SAME

BACKGROUND OF THE INVENTION

1. Field of the Invention

The present invention relates to a piezoelectric film type actuator used for a liquid discharge head, a sound generating device, such as a microphone, a speaker, various kinds of vibrators or oscillators, as well as a sensor or the like, and also, relates to the method of manufacturing the same. Further, the invention relates to a liquid discharge head that uses the piezoelectric film type actuator, and the method of manufacture therefor. In this respect, the piezoelectric film type actuator referred to in the subject specification is a member that converts electric energy to mechanical energy such as to effectuate mechanical displacements, vibrations, or stresses. Also, it is a member that reverses such a conversion.

2. Related Background Art

In recent years, there has been a demand for a displacement element for adjusting the length and the position of optical path on a sub-micron order or a sensing element for detecting micro displacements as electrical changes in the fields of optics and precision processing. To meet this demand, there has been in progress a development of a piezoelectric film type actuator, which is a member that utilizes the displacement or the inverse phenomenon thereof based on the reverse piezoelectric effect or electric distortion when an electric field is applied to the piezoelectric or electrically distortional material of a ferroelectric element.

Also, conventionally, it has been preferred to adopt the unimorph type or the bimorph type for the formation of a piezoelectric film type actuator used for the liquid discharge recording head or the like. In this respect, for the liquid discharge recording apparatus that uses a piezoelectric film type actuator of the kind for the enhancement of the printing quality and the printing speed, among some others, in order to meet such demand, the development has been in progress for the implementation to make the piezoelectric film type actuator smaller at a higher density, which can be driven at a lower voltage, but with a higher response performance, as well as for the provision of an elongated multiple nozzle.

Now, in order to obtain a large flexure displacement, a generating power, or a generation potential with the aforesaid unimorph- or bimorph-piezoelectric film type actuator, it is important to make the base plate that becomes the oscillating plate thinner. Here, however, the thickness of such a base plate is decreased and the strength thereof is reduced, leading to the problem that the smoothness is eventually reduced. Further, there is a problem for the conventional unimorph- or bimorph-piezoelectric film type actuator that the reliability thereof is marred due to the use of a bonding agent.

To overcome these problems, it is disclosed in the specification of Japanese Patent Application Laid-Open No. 62-213399 an increased bonding strength is provided by sintering piezoelectric ceramics and ceramics oscillating plate at a time without using any bonding agent.

However, in this method, different materials are sintered at high temperature. As a result, the oscillating plate and the piezoelectric ceramics are shrunk themselves, making it difficult to adjust the dimensional precision in the order of a micron on a large area. For that matter, the highly reliable piezoelectric film type actuator having a large area, or the liquid discharge head, can hardly be obtained.

SUMMARY OF THE INVENTION

It is an object of the present invention to provide a highly reliable piezoelectric film type actuator that can be highly integrated, making it possible to obtain large displacements at a low driving voltage with a high response speed, and also, to provide a liquid discharge head that uses such a piezoelectric film type actuator, as well as to provide the method of manufacture for each of the above.

It is another object of the invention to obtain a method for manufacturing a piezoelectric film type actuator having a piezoelectric film and an oscillating plate structural member bonded thereto, which method comprises the steps of forming a piezoelectric film on an intermediate transfer member; bonding the piezoelectric film on the intermediate member and the oscillating plate structural member; and peeling off the intermediate transfer member from the piezoelectric film.

For the method of the present invention for manufacturing a piezoelectric film type actuator, it is preferable for the piezoelectric film to contain lead, titanium, and zirconium. Also, the piezoelectric film may be the one which is patterned.

For the method of the present invention for manufacturing a piezoelectric, it is preferable that in the step of bonding the piezoelectric film and the oscillating plate structural member, the piezoelectric film and the oscillating plate structural member are bonded by means of energized beating, low temperature heating, or energized contact under pressure though a single metal, an alloy, a metal oxide, a metal nitride, or a metallic compound. Also, it is preferable to make the surface roughness Ra of the piezoelectric film 0.01 $\mu$m to 2.5 $\mu$m. More preferably, it is made 0.02 $\mu$m to 1.0 $\mu$m.

For the method of the present invention for manufacturing a piezoelectric film type actuator, it is preferable that in the step of peeling off the intermediate transfer member from the piezoelectric film, the intermediate transfer member is peeled off by the irradiation of a laser beam, such as an excimer laser beam or an infrared laser beam, among some others, through the intermediate transfer member.

For the method of the present invention for manufacturing a piezoelectric film type actuator, it is preferable that in the step of peeling off an intermediate transfer member from a piezoelectric film, a fluid flux (water jet) is discharged between the intermediate transfer member and the piezoelectric film to peel off the intermediate transfer member. It is also preferable to form a porous layer having a concentration of 30% to 95% between the intermediate transfer member and the piezoelectric film.

It is still another object of the present invention to provide a method for manufacturing a liquid discharge head provided with a base plate portion having liquid discharge ports, liquid chambers connected with the liquid discharge ports, and a piezoelectric film type actuator formed by a piezoelectric film and an oscillating plate provided for a part of the liquid chambers, for discharging liquid from the liquid discharge ports by means of the flexural oscillation of the piezoelectric film type actuator, which comprises the steps of forming a piezoelectric film on an intermediate transfer member; bonding the piezoelectric film on the intermediate member and the oscillating plate structural member, and peeling off the intermediate transfer member from the piezoelectric film.

The piezoelectric film type actuator of the present invention is characterized in that it is manufactured by the aforesaid method for manufacturing a piezoelectric film type actuator. Also, the liquid discharge head of the present invention is characterized in that it is manufactured by the aforesaid method for manufacturing a liquid discharge head.

In accordance with the present invention, the piezoelectric film is not formed directly on the oscillating plate structural member, but through the intermediate transfer member. The step of forming the piezoelectric film and that of bonding the piezoelectric film to the oscillating plate structural member are separated. The film formation process of the piezoelectric film and the manufacturing process of the actuator are functionally separated. A wide selection of material is made possible for the oscillating plate structural member as an actuator, hence obtaining an advantage to provide a film after adjusting the performance thereof arbitrarily as a piezoelectric film. Also, when the piezoelectric film and the oscillating plate structural member are bonded, it is possible to set the heating temperature at 500° C. or less for bonding, and the surface roughness Ra of the piezoelectric film is defined to be 0.01 $\mu$m to 2.5 $\mu$m. Then, bonding is effectuated by means of energized heating, low heating, or energized contact under pressure through a metal, an alloy, a metal oxide, a metal nitride, or a metallic compound. The bonding strength and durability are thus enhanced without using a bonding agent to provide a highly reliable piezoelectric film type actuator.

Further, the intermediate transfer member can be peeled off easily mechanically or by the irradiation of a laser beam without damaging the piezoelectric film. As a result, the intermediate transfer member can be utilized again.

In this way, it becomes possible to obtain a piezoelectric film type actuator capable of providing a large area and high integration, as well as generating large power, with which a large displacement is obtainable at a low driving voltage with a high response speed. Further, it becomes possible to manufacture a highly reliable elongated liquid discharge head in high density, which is capable of obtaining a large displacement at a low driving voltage with a stable and high response.

BRIEF DESCRIPTION OF THE DRAWINGS

FIGS. 3A, 3B and 3C are views, which show the process of forming a piezoelectric film on an intermediate transfer member in accordance with the method for manufacturing a liquid discharge head embodying the present invention.

DETAILED DESCRIPTION OF THE PREFERRED EMBODIMENTS

Hereinafter, with reference to the accompanying drawings, the embodiments in accordance with the present invention will be described.

FIGS. 1A to 1D are the views, which illustrate the main process of a method for manufacturing a piezoelectric film type actuator in accordance with the present invention.

The main process of the method of manufacture for the piezoelectric film type actuator (hereinafter referred to simply as an actuator) in accordance with the present invention consists of the process of forming a piezoelectric film on an intermediate transfer member, the process of bending the piezoelectric film on the intermediate transfer member to the structural member of an oscillating plate, and the process of peeling off the intermediate transfer member from the piezoelectric film as shown in FIGS. 1A to 1D.

Figure 1A:
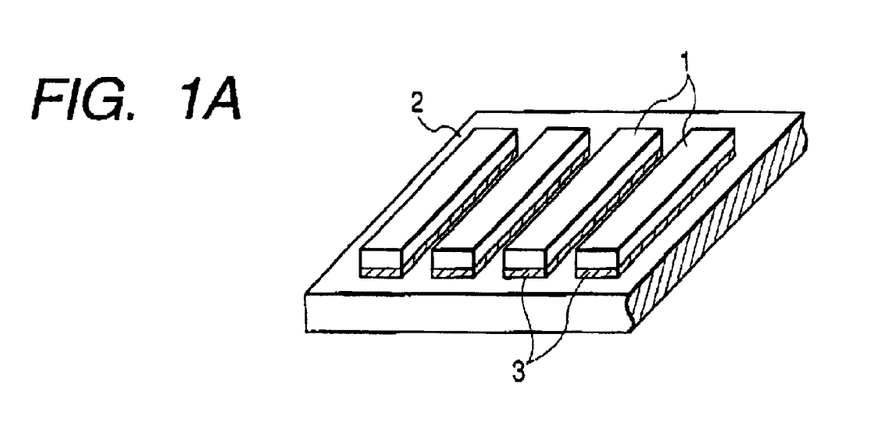
FIGS. 1A, 1B, 1C and 1D are views that illustrate the main process of a method for manufacturing a piezoelectric film type actuator in accordance with the present invention.

In the first process, that is, the process of forming the piezoelectric film on the intermediate transfer member, a porous layer 3 is formed on an intermediate transfer member 2 as shown in FIG. 1A. Then, piezoelectric film 1 is formed thereon.

For the formation of the piezoelectric film 1, it is possible to appropriately adopt the known method, such as sintering, sputtering, sol-gel, CVD, hydrothermal synthesis, laser ablation, or gas deposition, among some others, and select the piezoelectric film composition and the method of manufacture, which can provide characteristics fit for an intended use. As the composition of the piezoelectric film 1, there may be usable such composition as lead zirconia titanate (PZT), barium titanate, or barium zirconia titanate having the perovskite structure, which is an oxide composed of lead, titanium, and zirconium or a composition obtainable by adding Mn, Nb, La, Ge, or some other element to any one of them. As the crystallinity of the piezoelectric film, either a polycrystalline element or a single crystalline element may be usable. Also, as the mode of the piezoelectric film 1, a patterned mode is represented in FIG. 1A, but various modes may be employed depending on usage, and the mode is not necessarily limited to the patterned one. As the patterning method, there is the one that dry or wet etches a solid film, performs sand blasting or cutting process mechanically, or patterns after forming a metal mask or resist at the time of film formation. Further, there is a lift-off method where a highly precise mold is formed with a light hardening type resin, and a PZT paste is buried in-between. The film thickness of the piezoelectric film 1 is 0.1 μm to 20 μm, or preferably, 0.5 μm to 12 μm.

Also, as the intermediate transfer member 2 that forms the piezoelectric film 1, inorganic oxide, such as alumina, zirconia, magnesia, or sapphire, is used. Here, a single crystal may be used depending on usage. Also, it is preferable to set the film thickness of the intermediate transfer member 2 at 10 μm to 5 mm, or more preferably, 100 μm to 2 mm. If the film thickness of the intermediate transfer member 2 is less than 10 μm, a problem is encountered in that it becomes unfavorable to maintain the shape of the piezoelectric film 1, and also, in that it becomes difficult to handle the piezoelectric film for bonding at the next step. Also, it is not preferable to make the film thickness more than 5 mm, because there is then a problem in that the intermediate transfer member 2 cannot be peeled off easily without damaging the piezoelectric film 1 when peeled from the intermediate transfer member 2 after bonding. Also, on the intermediate transfer member 2, electrodes for actuator use can be formed in advance. Here, as described later, there may be the case where the optical property or the layer structure of the intermediate transfer member 2 is limited depending on the method of peeling in the peeling process subsequent to bonding.

The porous layer 3 is formed to make it easier to peel off the intermediate transfer member 2 after the piezoelectric film 1 is bonded to the oscillating plate structural member 4. It is preferable to form the porous layer 3 with a material containing carbon or non-sintering ceramics. For example, then, on the intermediate transfer member 2, a layer that contains carbon and metallic oxide is formed in advance, and the piezoelectric film 1 and the intermediate transfer member 2 are separated by breaking the brittle porous layer 3 when the layer that contains carbon becomes a brittle metal oxide layer due to heat from firing the piezoelectric film 1. In this way, the intermediate transfer member 2 can be peeled off easily. Here, as described later, depending on the peeling method, such as using the irradiation of laser beam, for example, it is possible to peel off the intermediate transfer member 2 without any intervention of the porous layer 3.

Also, the surface roughness Ra on the side of the piezoelectric film 1 where it is bonded to the oscillating plate structural member 4 should desirably be within a range of 0.01 μm to 2.5 μm. More preferably, it is within a range of 0.02 μm to 1.0 μm. It is preferable to keep the surface roughness Ra of the piezoelectric film 1 within the surface roughness Ra of the aforesaid range in order to enhance the durability of the actuator, while making it possible to bond the piezoelectric film 1 to the oscillating plate structural member 4 at lower temperature under lower pressure (see FIG. 1B). If the surface roughness Ra of the piezoelectric film 1 is less than 0.01 μm, the bounding strength becomes insufficient, and a problem may be encountered in some cases in that the structure member 4 of the oscillating plate and the piezoelectric film 1 are peeled off in the peeling step in the following process. Also, it is not preferable to allow the surface roughness Ra of the piezoelectric film to exceed 2.5 μm, because then the characteristics of the actuator (characteristics of its displacement and frequency) become defective. With the surface roughness Ra of the piezoelectric film 1 being kept within the range as described above, it becomes possible to obtain a good bonding strength, and a highly reliable actuator in particular. Also, the surface roughness Ra1 of the oscillating plate 5 of the structural member 4 thereof, which is in contact with the piezoelectric film 1, should desirably be such as to make the difference of absolute values, |Ra1−Ra|, 0.5 μm or less with respect to the surface roughness Ra of the piezoelectric film 1. Here, the surface roughness can be measured by using a surface roughness meter "Surfcoder" manufactured by Kosaka Institute.

Figure 1B:
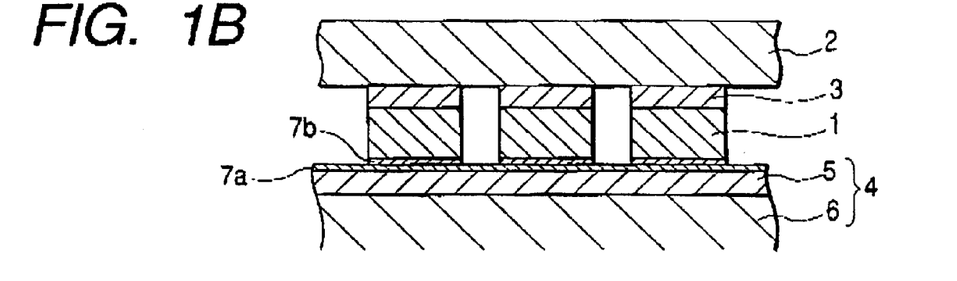

Now, in the second process, which is the step of bonding the piezoelectric film to the oscillating plate structural member, there is formed the oscillating plate structural member 4 with the oscillating plate 5 and the base plate portion 6 that constitute the actuator as shown in FIG. 1B. Here, the oscillating plate 5 and the base plate 6 may be formed integrally or bonded together. For the oscillating plate structural member 4, heat resistance is needed so that it is not deformed by heat when bonded to the piezoelectric film 1. It is preferable to use a material having a heat resistance of 150° C. or more. In this respect, the heat resistance of 150° C. or more means that the possible dimensional displacement is less than 3% after a heat treatment under an atmosphere at 150° C. for a period of 30 minutes.

For the oscillating plate 5, a material having the Young's modulus of 50 GPa or more, such as SUS, Ti, zirconia, Si, Cu, SiO$_2$, glass, or Cr, is usable. The oscillating plate 5 may be a one-layer structure or a plural-layer structure. Even in a case of the plural-layer structure, there is a need for providing the Young's modulus of 50 GPa or more as a whole. The film thickness of the oscillating plate 5 is 0.5 μm to 20 μm. More preferably, it is 1 μm to 10 μm. Also, for the oscillating plate 5, it may be possible to use the one which is doped with a minute amount of a metal, such as Y or B.

The material of the base plate 6 of the oscillating plate structural member 4 may be the same as the material of the oscillating plate 5, but a ceramics compound material that contains alumina, cellcyan, magnesia, or carbon fiber may be useable as another material therefor. When the actuator is applied to a liquid discharge bead, it may be possible to use a Si base plate or a SUS base plate for the base plate portion 6, for example, which is processed to have formed a liquid chamber in advance or yet to be processed to provide a liquid chamber in the post process that may follow. The liquid chamber of the liquid discharge head can be formed by machining, etching, or the like.

Then, when the piezoelectric film 1 and the oscillating plate structural member 4 are bonded, a bonding layer 7 (or bonding layers 7a and 7b) of a metal, a metal alloy, a metal oxide, a metal nitride, or a metallic compound substance is filmed on both the surface of the piezoelectric film 1 and of the oscillating plate 5 to be bonded or on either one of these surfaces as shown in FIG. 1B. As the metal or alloy to be filmed on the surfaces of the oscillating plate structural member 14 and piezoelectric member 11 to form the bonding layers 7 (7a and 7b), a metal of at least one kind or more is usable among Pd, In, Sn, Ni, Ga, Cu, Ag, Mo, Ti, Zr or some other metal, and also, as the alloy, PdIn$_3$, Al—Cu, Ti—Ni, or the like is usable. As the metal oxide, there is SiO$_2$, CaO$_2$, TiO$_2$, ZnO, or the like, for example. As the metal nitride, there is TiN, Si$_3$N$_4$, or the like, for example. As the metallic compound substance, there is Ti—Ni, Ag—Ni, Fe—Co, Cr—Mo, or the like, for example. In this manner, on both surfaces or either one of the surfaces of the oscillating plate structural member 4 and the piezoelectric member 1, the bonding layer 7 (7a and 7b) is filmed, and after these members abut against each other, both of them are bonded by energized heating, energized contact under pressure, low-temperature heating, or the like.

Here, the energized heating used for bonding is a method of bonding by means of heat generated when current flows through a conductive layer. The quantity of current is 0.5 A/cm² to 200 A/cm² or preferably it is 1 A/cm² to 50 A/cm². The energized contact under pressure is a method of a still firmer bonding by exerting pressure in addition to the aforesaid energized heating method. Also, the low-temperature heating is a method of bonding by forming an alloy on the bonding surfaces with a combination of different kinds of metals that form alloys at a temperature of 300° C. or less. Particularly, with a combination of Pd and In, it is possible to form an alloy of $PdIn_3$ at about 250° C. Therefore, this combination is preferable for a bonding at a lower temperature. Besides this combination, it is possible to bond by combining Ag—Ni, Ti—Ni, Zr—Cu, among some others.

Figure 1C:
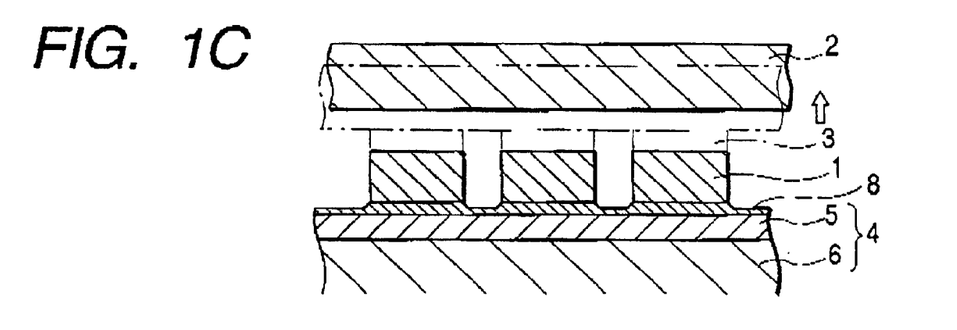

The third process, which is a step of peeling off the piezoelectric film from the intermediate transfer member, is that, as shown in FIG. 1C, the intermediate transfer member 2 is cut off from the actuator, which is formed by bonding the piezoelectric film 1 and the oscillating plate structural member 4. As the technique used for peeling off the intermediate transfer member 2, there is one where a porous layer 3 is provided between the intermediate transfer member 2 and the piezoelectric film 1, and this porous layer 3 is mechanically destroyed so as to peel off the intermediate transfer member 2. There is also the one where the intermediate transfer member 2 is destroyed by a water jet method so as to peel it off or to peel off the intermediate transfer member 2 by means of rapid heating by the irradiation of a laser beam. In this respect, no porous layer 3 may be required for the technique that employs the irradiation of a laser beam for peeling.

For the application of the former two techniques (mechanical peeling and peeling by the water jet method), it is preferable to form a porous layer 3 of 30% to 95% concentration or preferably that of 50% to 95% concentration on the interface between the piezoelectric film 1 and the intermediate transfer member 2 when the piezoelectric film 1 is formed. The film thickness of the porous layer 3 is 0.5 μm to 200 μm or preferably 1.0 μm to 100 μm. With regard to this porous layer 3, the ceramic oxide layer that contains carbon is produced in advance on the intermediate transfer member 2, for example, and a porous layer is formed on the interface by carbon, which is fired when the piezoelectric film 1 is fired at a high temperature, and then, this brittle porous layer is mechanically destroyed to easily peel off the piezoelectric film 1 from the intermediate transfer member 2. In this respect, the concentration of the porous layer can be determined with the measurement of the aperture area by observing the section of the porous layer using a TEM (Transparent Electronics Microscope).

Further, it is a preferable mode that conductivity is provided to the porous layer 3 to utilize it as the actuator electrodes. In such a case, a paste, which is prepared by the dispersion and mixture of metallic particles, carbon material, and ceramic particles in a solgel solution of SRO (strontium ruthenium oxide) or ITO, is coated to produce a film, thus obtaining a conductive porous layer.

Also, when the intermediate transfer member 2 is peeled off through the porous layer 3, it becomes easier to separate them with the collision of a highly pressurized fluid flux (water jet) with the porous layer 3. Generally, the water jet method is such as to cut or process ceramics, metal, resin, rubber, or woods, or perform a surface rinsing or the like by discharging a highly pressurized flux of water flow onto an object at high speed. As an example in which the water jet method is used, there are the following disclosures:

K. Ohmi et al. "Water Jet Splitting of Thin Porous Si for ELTRAN", The Japan Society of Applied Physics, Tokyo, pp. 345 to 355 (1999); and R. Herino et al. "Microstructure of Porous Silicon and its Evaluation with Temperature", Mater. Let. 2, pp. 519 to 523 (1984). In accordance with the present invention, the water jet is discharged to the porous layer 3 to selectively collapse the porous layer 3 so as to enable the intermediate transfer member 2 to be separated. The pressure of the fluid used as the water jet is $5.0 \times 10^4$ kPa to $80.0 \times 10^4$ kPa or preferably, $10.0 \times 10^4$ to $50.0 \times 10^4$ kPa.

With regard to the technique of peeling off the intermediate transfer member by irradiating a laser beam, the piezoelectric film 1 is formed on the intermediate transfer member 2, and then, after an oscillating plate structural member 4 is bonded thereto, a laser beam is irradiated onto the piezoelectric film 1 from the opposite side of the oscillating plate 5 through the intermediate transfer member 2 for rapid heating, and by the difference in the instantaneous thermal expansion or thermal decomposition, the piezoelectric film 1 and the intermediate transfer member 2, which is a transparent base plate, are separated. As a laser beam, an excimer laser or an infrared laser can be used. When an excimer laser beam is applied, a material having a transmittance of 20% or more for light of 230 nm to 260 nm wavelength is used as the intermediate transfer member 2. Also, when an infrared laser beam is applied, a material having a transmittance of 20% or more for 700 nm to 1,250 nm is used as the intermediate transfer member. As the irradiating energy of the laser beam, it is preferable to apply 50 to 1,000 mJ/cm².

When an excimer laser beam is used for peeling, the intermediate transfer member 2 is sufficient if a material used therefor has a transmissivity of approximately 230 nm to 260 nm, while withstanding a temperature of 900° C. or more at the time of firing the piezoelectric film array. Then, the intermediate transfer member functions sufficiently when this method is applied, and MgO substrate, alumina, sapphire, quartz glass, $CaCO_3$, LiF, or the like can be used, for example. Also, when peeling is effectuated by use of an infrared laser, such as a carbon gas laser or a YAG laser, the material, which presents a translucency of approximately 700 nm to 1,250 nm, while withstanding a temperature of 900° C. or more at the time of firing the piezoelectric film array, can function sufficiently as the intermediate transfer member for this method, and MgO, $MgF_2$, $Y_2O_3$, $CaF_2$, quartz glass, alumina, sapphire, or $SrTiO_3$ single crystal substrate can be used, among some others.

Figure 1D:
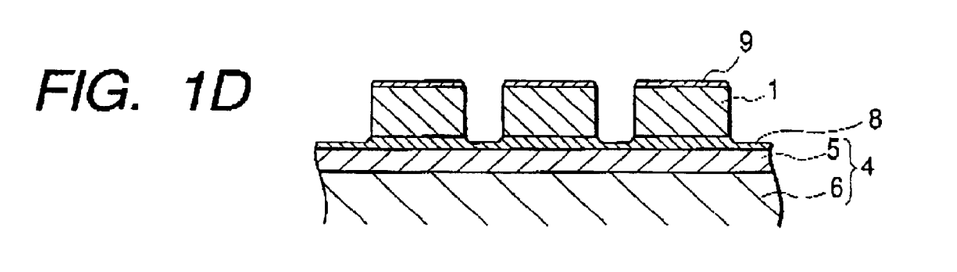

In the processes described above, the piezoelectric film type actuator is formed with the piezoelectric film 1 and the oscillating plate structural member 4 being bonded as shown in FIG. 1D. Here, in FIG. 1D, a reference numeral 9 designates upper electrodes.

In the manufacture of the piezoelectric film type actuator as described above, the process to form the piezoelectric film 1 and the process to bond the piezoelectric film 1 to the oscillating plate structural member 4 are separated, and the film formation process of the piezoelectric film 1 and the manufacturing process of the oscillating plate structural member are functionally separated. Therefore, there is a wide selection of materials that can used for the oscillating plate structural member 4 serving as the actuator. Further, there is an advantage in that the film is obtainable after arbitrarily adjusting the performance of the piezoelectric film 1.

When the piezoelectric film and the oscillating plate structural member are bonded, the heating temperature can be set at as low as 500° C. or less for bonding. Also, with the surface roughness Ra of the piezoelectric film being 0.01 μm to 2.5 μm, bonding is made by means of energized heating, low temperature heating, energized contact under pressure, or the like through a metal, an alloy, a metal oxide, a metal nitride, or a metallic compound without using any bonding agent. In this way, it becomes possible to enhance the bonding strength and durability, thus obtaining a highly reliably piezoelectric film type actuator. Further, the intermediate transfer member can be peeled off mechanically or by the irradiation of a laser through the porous layer easily without damaging the piezoelectric film. Also, the intermediate transfer member can be utilized again.

In this way, it becomes possible to obtain an element capable of obtaining a large displacement at a lower driving voltage with a large generating power at a faster response, which can also provide a large area for a higher integration arrangement. Thus, a highly reliable, large-area piezoelectric film type actuator can be manufactured, which can be preferably utilized for a sound generating device, such as a microphone, a speaker, various kinds of vibrators and oscillators, and various kinds of sensors, such as an acceleration sensor, a pressure sensor, a vibration sensor, an angular velocity sensor, in addition to a liquid discharge head.

Next, with reference to FIGS. 2A, 2B and 2C to FIGS. 8A, 8B, 8C, 8D, 8E and 8F, a liquid discharge head to be manufactured using the method for manufacturing the piezoelectric film type actuator of the present invention, and the method of manufacture thereof, will be described.

Figure 2A:
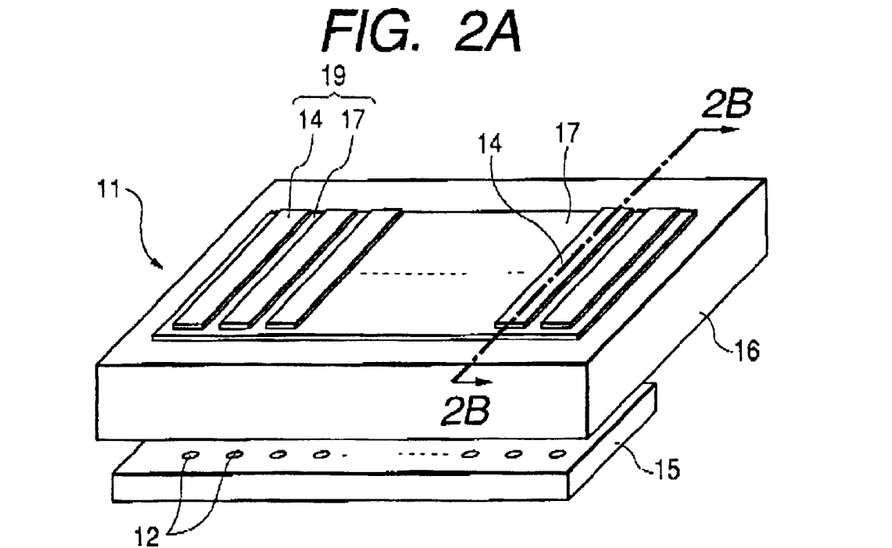
FIG. 2A is a perspective view, which shows a liquid discharge head in accordance with the present invention.
Figure 2B:
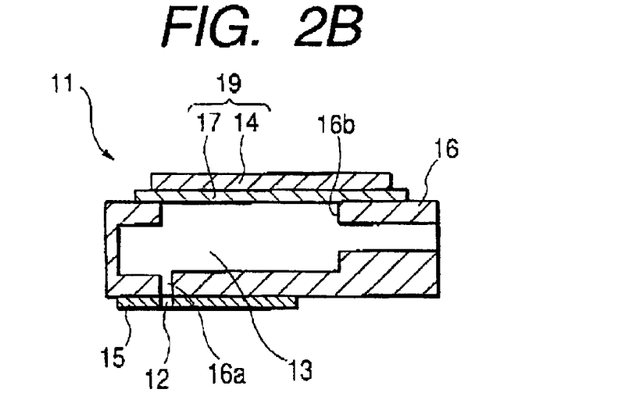
FIG. 2B is a cross-sectional view, which shows the liquid discharge head represented in FIG. 2A, taken along line 2B—2B in FIG. 2A.

A liquid discharge head 11 of the present invention has a plurality of liquid discharge ports 12; the liquid chamber 13, which is installed for each of the liquid discharge ports 12; and each the piezoelectric films 14 arranged for each of the liquid chambers 13, respectively, as shown in FIG. 2A and FIG. 2B. Here, in FIGS. 2A and 2B, the liquid discharge ports 12 are arranged on the lower end side, but these ports can be on the side end side.

For the liquid discharge head 11, the liquid discharge ports 12 are formed on a nozzle plate 15 at designated intervals, and the liquid chambers 13 are formed on a base plate portion 16 parallel to the liquid discharge ports 12, respectively. Each of the liquid chambers 13 and the corresponding liquid discharge port 12 are connected respectively through the liquid flow path 16a formed on the base plate portion 16. Also, on the upper face of the base plate portion 16, the opening portion 16b is formed for each liquid chamber 13 correspondingly, and the oscillating plate 17 is formed to cover the opening portion 16b on the upper face of the base plate portion 16. Then, the piezoelectric film 14 is arranged on the oscillating plate 17 to be positioned corresponding to each liquid chamber 13.

Figure 2C:
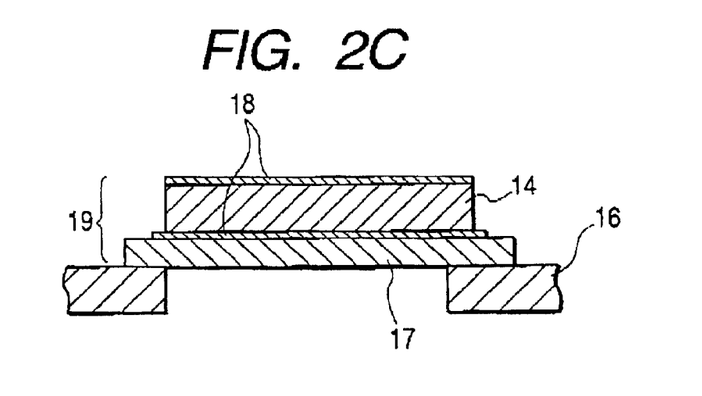
FIG. 2C is an enlarged cross-sectional view, which shows the piezoelectric film type actuator of the liquid discharge head of the present invention.

Also, on the upper and lower faces of the piezoelectric film 14, electrodes 18 of Pt, Au, Al, or the like are positioned, as shown in FIG. 2C, and arranged on the oscillating plate 17, respectively. As the composition of the piezoelectric film 14, there may be usable such composition as lead zirconia titanate (PZT), barium titanate, or barium zirconia titanate having the perovskite structure, which is an oxide composed of lead, titanium, and zirconium or a composition obtainable by adding Mn, Nb, La, Ge, or some other element to any one of them. In this way, the piezoelectric film type actuator (piezoelectric oscillating portion) 19 is formed by the piezoelectric film 14 having the electrodes 18 formed therefor, and the oscillating plate 17, as well.

The liquid discharge head 11 is a device manufactured by the same method as the one for manufacturing the aforesaid piezoelectric film type actuator. Particularly, each of the piezoelectric films is formed in parallel at high density, while each of the liquid chambers, which is formed on the base plate portion of the oscillating plate structural member formed by the oscillating plate and the base plate portion, is arranged in parallel at high density, the same as piezoelectric films. In this respect, for manufacturing the actuator, the base plate portion may be either a base plate having the liquid chamber processed in advance or a base plate with the liquid chamber yet to be processed. Also, the base plate portion may be integrally formed with the oscillating plate or bonded to the oscillating plate. The liquid chamber formed for the base plate is machined or etched to be the space where liquid flows in, and the liquid chamber may be configured to be rectangular, oval, or the like. Also, the liquid chamber is communicated with the liquid flow path into which liquid is supplied from a liquid tank. Also, between the liquid chamber and the liquid tank, means for preventing reverse flow may be processed.

Also, a plurality of piezoelectric films and liquid chambers of the oscillating plate structural member are formed respectively to correspond to each other to make it possible to form a liquid discharge head with good dimensional precision where the variation of dimensional precision of the piezoelectric film is suppressed to be within ±5%. Here, the dimensional precision of the piezoelectric film means that variations of the width, length, and height of the piezoelectric film are kept within ±5%, respectively.

In order to enhance the bonding strength of the oscillating plate structural member and the piezoelectric film and the durability as the actuator and the liquid discharge head, it is preferable to make the surface roughness Ra of the piezoelectric film 0.01 μm to 2.5 μm. Then, with the surface roughness Ra of the piezoelectric film being kept within the aforesaid range, it becomes possible to obtain a device having a small variation of displacement between each element and that of oscillation characteristics. Here, a small variation of displacement means that the maximum amount of variation of the oscillating plate is kept within ±7%. Also, a small variation of oscillating characteristics means that the increased or decreased amount of displacement is constant between each of the elements at frequencies 10 kHz to 25 kHz.

Next, a detailed description will be made of the method of the present invention for manufacturing a liquid discharge head in accordance with specific embodiments.

FIGS. 3A, 3B and 3C to FIG. 7 are views, which schematically illustrate each specific process of the method for manufacturing a liquid discharge head in accordance with a first embodiment of the present invention.

Figure 3A:
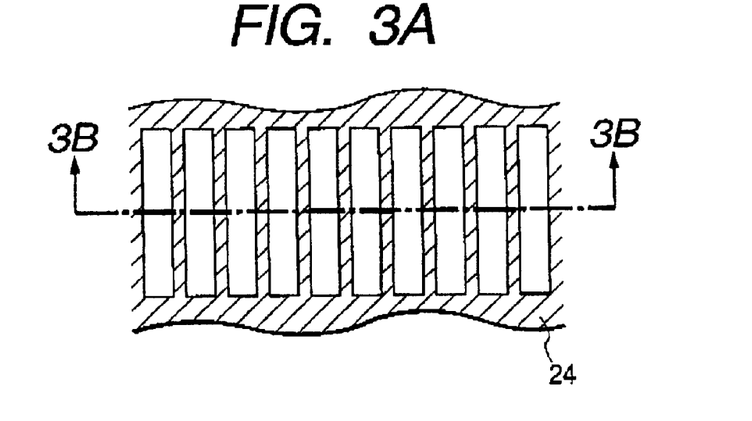
FIG. 3A is a plan view showing the state of forming a resin pattern on an intermediate transfer member.
Figure 3B:
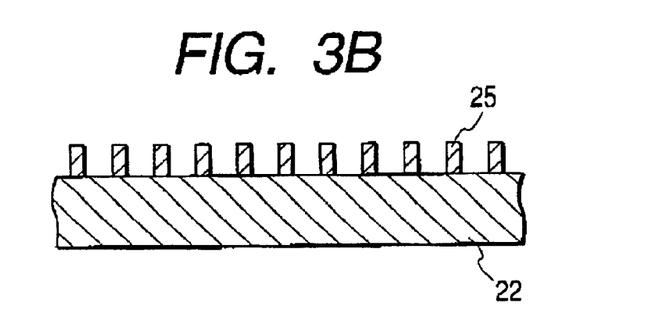
FIG. 3B is a cross-sectional view taken along line 3B—3B in FIG. 3A.

In the step of forming a piezoelectric film on an intermediate transfer member, a polycrystal base plate of MgO in a size of 1 mm thick×5 cm long×1 cm wide is used as the intermediate transfer member 22. On the MgO intermediate transfer member 22, a rectangular mold 25 is formed at an interval of 300 dpi density using photosensitive resin 24, as shown in FIGS. 3A and 3B.

Figure 3C:
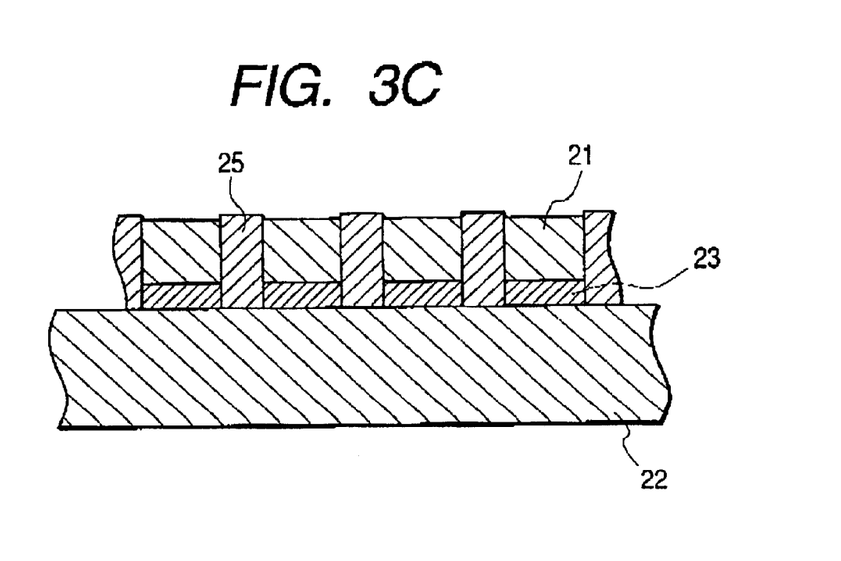
FIG. 3C is a cross-sectional view, which shows the state of burying a complex material layer and a piezoelectric film paste between a mold formed on the intermediate transfer member.
Figure 4:
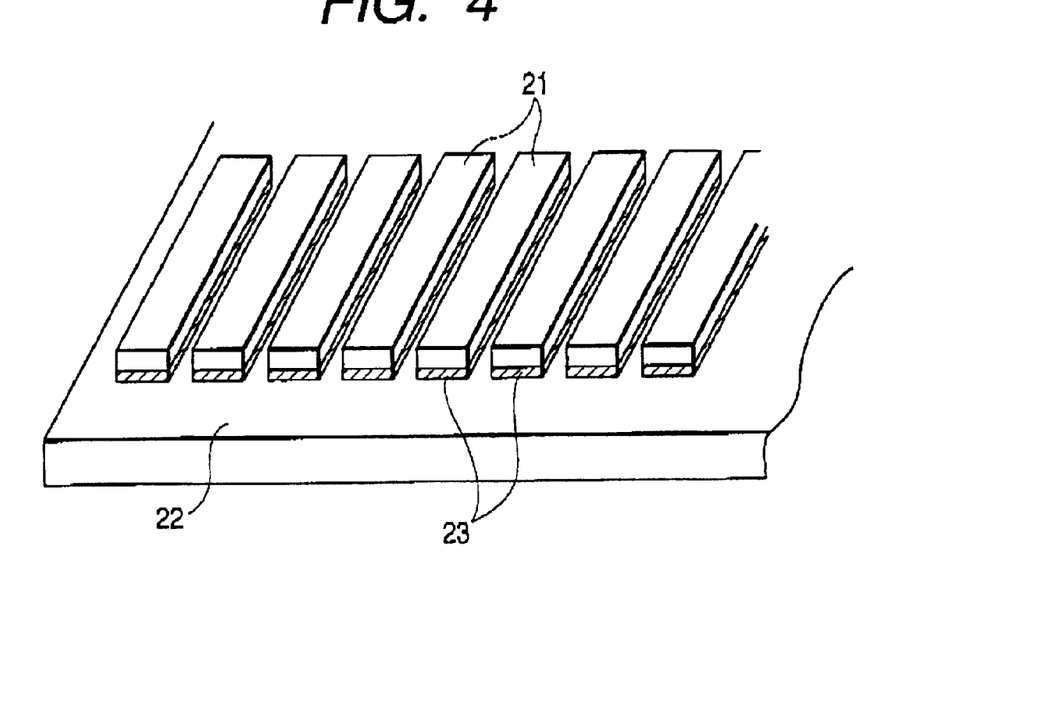
FIG. 4 is a perspective view, which shows the state of forming the piezoelectric film in an array by the process of forming the piezoelectric film on the intermediate transfer member in accordance with the method for manufacturing a liquid discharge head embodying the present invention.

Between each of the molds 25 formed on the MgO intermediate transfer member 22, a complex material layer 23 that contains carbon and $SiO_2$ is formed at first as shown in FIG. 3C. Then, on this layer, PZT (lead zirconia titanate) paste 21 is buried by means of screen printing. After that, a dying process is executed at a 100° C. to 150° C. This process is repeated three time until the mold 25 is filled up to the height thereof (8 μm). Subsequently, the regular firing is made at a temperature of 1,200° C. With this regular firing, the resin 24 is fired at the same time. In this way, the PZT array is formed, as shown in FIG. 4, to arrange the rectangular PZT piezoelectric films 21 in parallel at a density of 300 dpi. The surface roughness Ra of this PZT array is 0.6 µm. At this juncture, the complex material layer 23 that contains carbon and $SiO_2$, which is formed between the MgO intermediate transfer member 22 and the PZT piezoelectric film 21, is carbonized when the piezoelectric film 21 is fired, and becomes the porous layer 23 (approximately 3 µm thick) the density of which is 85%.

Figure 5:
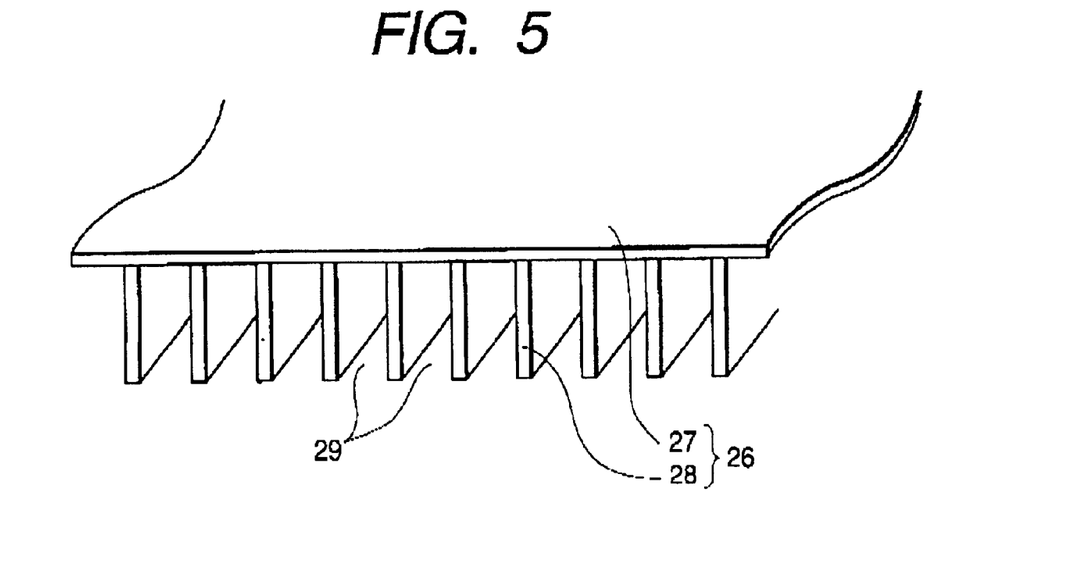
FIG. 5 is a perspective view, which shows the structural member of an oscillating plate to be bonded to the piezoelectric film in the method for manufacturing a liquid discharge head embodying the present invention.
Figure 6:
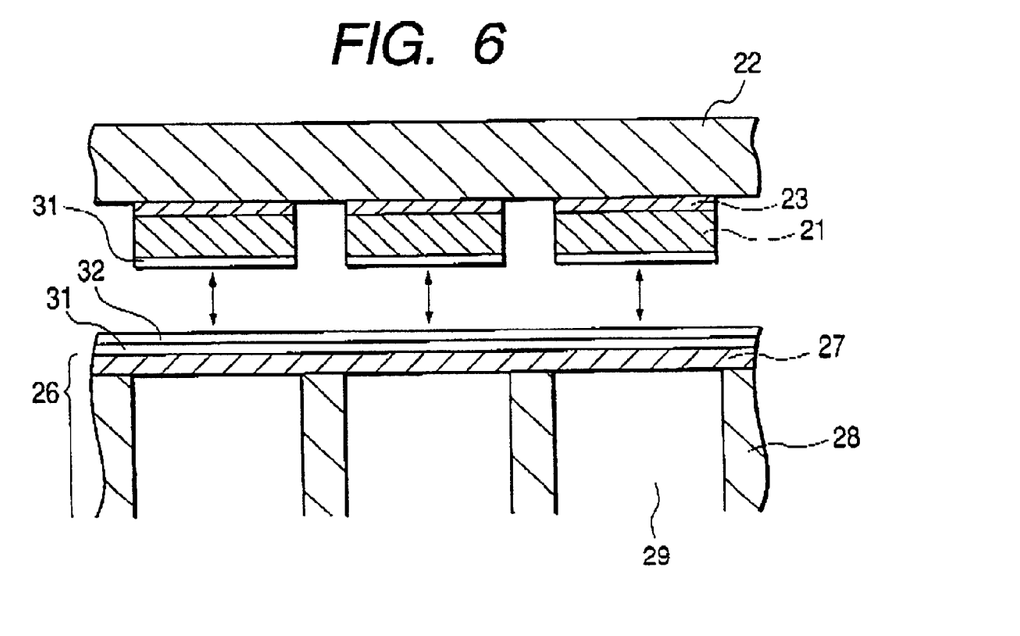
FIG. 6 is a cross-sectional view, which shows the process of bonding the piezoelectric film and the structural member of the oscillating plate in the method for manufacturing a liquid discharge head embodying the present invention.

In the next step, where the intermediate transfer member on the piezoelectric film and the oscillating plate structural member 26 are bonded, the oscillating plate structural member 25 to be bonded to the piezoelectric film 21 is structured, as shown in FIG. 5, by the oscillating plate 27 of SUS of 0.2 µm having the surface roughness Ra1 and the Si base plate portion 28 formed with the liquid chamber 29. When the oscillating plate structural member 26 and the PZT array formed as shown in FIG. 4 are bonded, the Pd layer 31 is filmed on the surface of the piezoelectric film 21 of the PZT array, as shown in FIG. 6, while the Pd layer 31 and the In layer 32 are filmed on the surface of the SUS oscillating plate 27 one after another. After contact is made, heating is conducted at a temperature of 250° C. to form the $PdIn_3$ alloy layer 33 (see FIG. 7), hence bonding the piezoelectric film 21 and the oscillating plate 27 together.

Then, in the step of peeling off the intermediate transfer member from the piezoelectric film, the MgO intermediate transfer member 22 is peeled off from the piezoelectric film 21. In accordance with the present embodiment, the porous layer 23 is formed between the MgO intermediate transfer member 22 and the PZT piezoelectric film 21. It is therefore possible to peel them off mechanically with ease.

For the present embodiment, it is made possible to form an array of 300 PZT piezoelectric films 21 per 25.4 mm (per inch) and transfer and bond it to the oscillating plate structural member 26 without a dimensional variation. The dimensional variation of the actuator thus manufactured is within ±3%.

Figure 7:
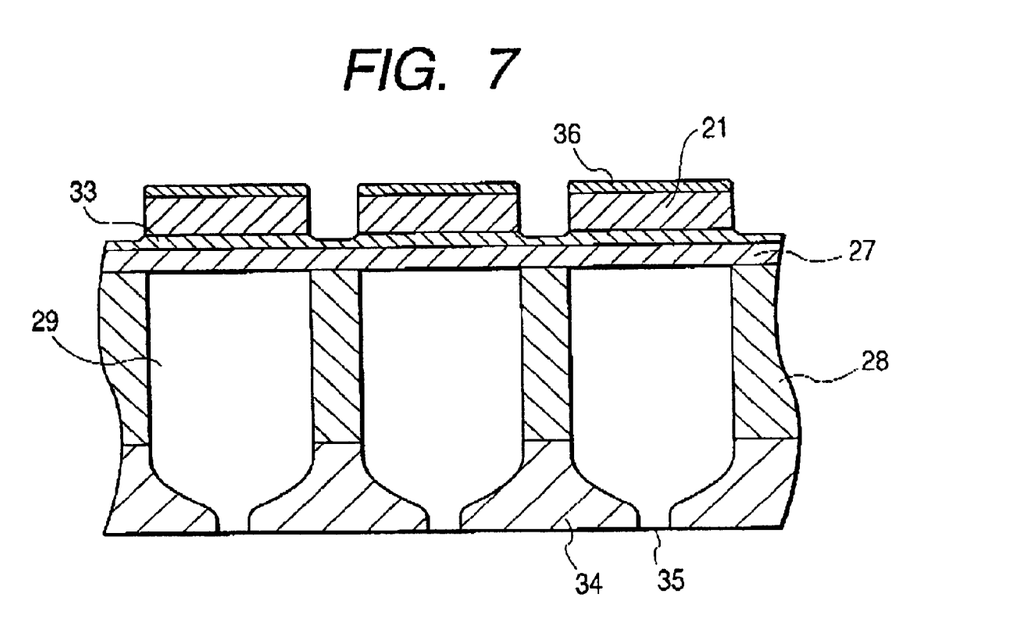
FIG. 7 is a cross-sectional view, which shows the liquid discharge head manufactured by the method for manufacturing a liquid discharge head embodying the present invention.

Lastly, a silicon nozzle plate 34, which is formed with nozzles (liquid discharge ports) 35 arranged corresponding to liquid chambers 29, is bonded to the oscillating plate structural member 26 as shown in FIG. 7. Thus, an elongated and high density liquid discharge head (see FIGS. 2A to 2C) is manufactured. Here, in FIG. 7, a reference numeral 36 designates upper electrodes.

Also, as the bonded allay layer 33, it is possible to film Pd and In as a single layer, respectively, and bond it to one side or to provide the laminated layer of In/Pd for both sides and bond it thereto.

With the liquid discharge head thus manufactured, it becomes possible to perform discharges at a speed of 11 m/s at a driving voltage of 20 V and a frequency of 15 kHz.

Next, with reference to FIGS. 8A to 8F, the description will be made specifically of the method for manufacturing a liquid discharge head in accordance with a second embodiment of the present invention.

Figure 8A:
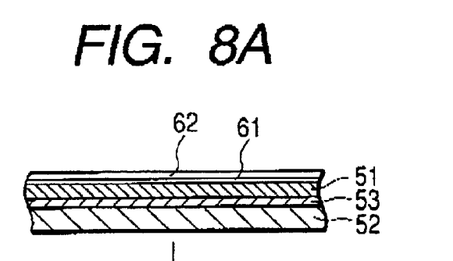
FIGS. 8A, 8B, 8C, 8D, 8E and 8F are views, which schematically illustrate the main process of the method for manufacturing a liquid discharge head in accordance with another embodiment of the present invention.

In the step of forming the piezoelectric film on the intermediate transfer member in accordance with the present embodiment, the dispersing solution, in which the same amounts of $Al_2O_3$ particles of approximately 0.4 µm each and $ZrO_2$ particles of approximately 0.3 µm each are mixed, is added to a Si alkoxide solution and coated on the single crystal MgO intermediate member (65% average transmissivity of 230 to 260 nm) 52, as shown in FIG. 8A. Then, a heating treatment is performed at the maximum temperature of 430° C. to burn and remove the organic component, hence forming a porous layer 53 of 9 µm thick having a density of 92%.

On the porous layer 53, PMN-PZT film 51 is formed in a thickness of 12 µm by the sintering process at a temperature of 1,100° C. The surface roughness Ra of the piezoelectric film 51 is 0.7 µm. On this film, Pd layer 61 of 150 nm is filmed by means of sputtering. Further, In layer 62 of 900 nm is filmed thereon.

Figure 8B:
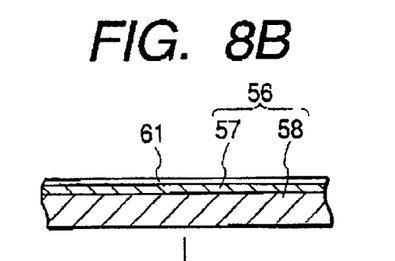

Also, as shown in FIG. 8B, there is prepared the oscillating plate structural member 56 in which the $ZrO_2$ oscillating plate (Young's modulus: 192 GPa) 57 of 5 µm thick is laminated on the SUS base plate 58 of 200 µm thick. The surface roughness Ra1 of the oscillating plate 57 is 0.5 µm. On the oscillating plate 57, Pd layer 61 of 120 nm is filmed.

Figure 8C:
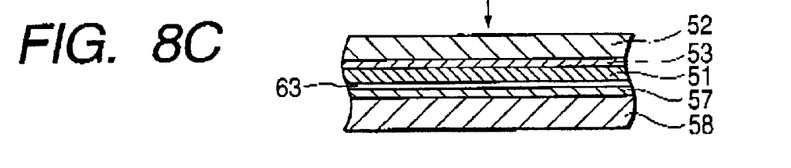

Subsequently, as shown in FIG. 8C, the PZT piezoelectric film 51 and the oscillating plate structural member 56 are superposed, and a heating treatment is performed at 200° C. for 30 minutes under a pressure of $2\times10^3$ kPa, thus forming an alloy layer 63 of $PdIn_3$ and bonding them.

Figure 8D:
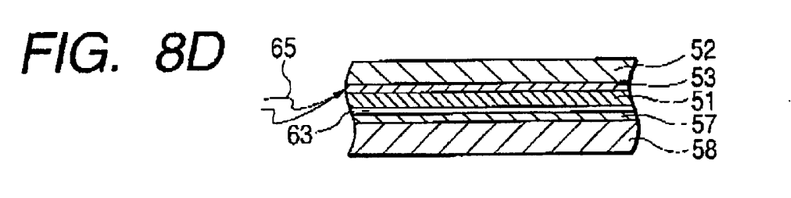
Figure 8E:
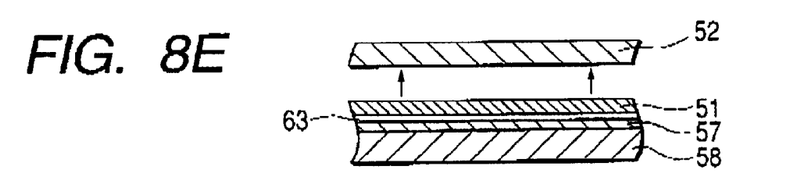

After that, as shown in FIG. 8D, a water jet 65 of $15\times10^4$ kPa is discharged by the water jet method onto the porous layer 53 to collapse the porous layer 53. In this way, the MgO intermediate transfer member 52 can be easily peeled off (see FIG. 8E).

Figure 8F:
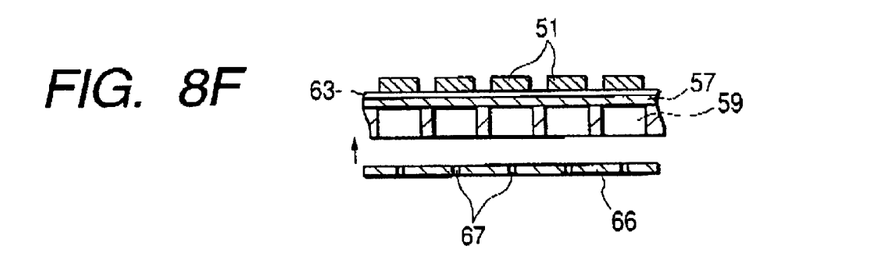

Then, as shown in FIG. 8F, the piezoelectric film 51 bonded to the oscillating plate structural member 56 is patterned by an etching process with a resolution of 180 dpi. After that, the SUS base plate 58 is also etched to produce each of the liquid chambers 59 on the lower part of the piezoelectric film 51. Then, the silicon nozzle plate 66, which is provided with liquid discharge ports (nozzles) 67 arranged corresponding to the liquid chambers 59, respectively, is bonded to the oscillating plate structural member 56 for the formation of an elongated and high density liquid discharge head device. In this way, it is possible to obtain the liquid discharge head (see FIGS. 2A to 2C), which is provided with the piezoelectric film type actuator. The bonding strength of the $ZrO_2$ oscillating plate 57 and the piezoelectric film 51 is firm, and there is almost no reduction in the amount of displacement even after the durability test, which is executed $10^7$ times at a driving voltage of 20 V at a frequency of 15 kHz.

Also, the piezoelectric film 51 is patterned to be in the form of array and then bonded to the oscillating plate structural member 56, and the intermediate transfer member 52 is peeled off by means of the water jet method. In this case, too, it is equally possible to obtain an excellent piezoelectric film type actuator. Also, when the bonding is made by a heating process at 450° C. using $SiO_2$ for the bonding layer, a firm strength is obtainable therefor. Bonding at 500° C. using $Si_3N_4$ also presents a firm strength.

Next, a method for manufacturing a liquid discharge head specifically in accordance with a third embodiment of the present invention will be described.

For the present embodiment, the piezoelectric film, which is formed in an array on the MgO intermediate transfer member (65% average transmissivity of 230 to 260 nm), is used. As in the case of the second embodiment described above, the piezoelectric film formed in the array is bonded to the oscillating plate structural member. After that, a laser beam is used as a means for peeling off the MgO intermediate transfer member.

Onto the portion where the piezoelectric film adheres, an excimer laser beam is irradiated from the MgO intermediate transfer member side at an energy of approximately 300 $mJ/cm^2$. All the piezoelectric film portions are irradiated. After being left intact at room temperature, the MgO intermediate transfer member is peeled off. Then, the piezoelectric film can be separated therefrom with ease. Also, it is confirmed that peeling is equally possible by the irradiation of a YAG laser beam at an energy of 400 mJ/cm².

Then, after a polymer protection film is provided for the piezoelectric film formed in array, the liquid chambers are produced by etching the SUS base plate. Subsequently, the protection film of the piezoelectric film is removed, and the piezoelectric film is rinsed by means of ion milling. Then, through the steps of the heating process and the Pt upper electrode formation process, a piezoelectric actuator is obtained.

With the piezoelectric type actuator thus manufactured, it is also confirmed that there is a sufficient amount of displacement up to a frequency of 30 kHz at a driving voltage of 20 V. Also, good corresponding displacements are confirmed with respect to the frequencies of the driving voltage. With this actuator, a liquid discharge head is manufactured as in the embodiment described earlier, and the discharge condition is examined with the result that liquid droplets are discharged stably at a speed of 13 m/s at a driving voltage of 20 V at a frequency of 15 kHz.

Next, the method for manufacturing a liquid discharge head specifically in accordance with a fourth embodiment of the present invention will be described.

As a piezoelectric film for the present embodiment, the piezoelectric film, which is manufactured in the same way as the second embodiment described earlier, is used, and as the oscillating plate structural member thereof, the oscillating plate structural member, which is manufactured in the same way as the first embodiment described above, is used. These are bonded by the energized contact under pressure. A Ni layer is provided for the piezoelectric film. Then, after the provision of an Ag layer on the oscillating plate side, electricity of 20 A is applied from the oscillating plate side to the end of the piezoelectric film under a pressure of $2.0 \times 10^3$ kPa. After the bonding process, a water jet is discharged at the porous layer as in the second embodiment to effectuate peeling. The piezoelectric film type actuator thus manufactured presents sufficient displacements at a driving voltage of 30 V.

What is claimed is:

1. A method for manufacturing a piezoelectric film type actuator having a piezoelectric film and an oscillating plate structural member bonded therefor comprising in this order the following steps of:
    (a) forming a first precursor layer of a material capable of becoming porous upon a firing step on an intermediate transfer member;
    (b) forming a second precursor layer comprising a material of said piezoelectric film on said first precursor layer;
    (c) forming said piezoelectric film by firing said second precursor layer;
    (d) bonding the piezoelectric film to said oscillating plate structural member; and
    (e) peeling off said intermediate transfer member from said piezoelectric film.

2. A method for manufacturing a piezoelectric film type actuator according to claim 1, wherein said piezoelectric film contains lead, titanium, and zirconium.

3. A method for manufacturing a piezoelectric film type actuator according to claim 1, wherein said piezoelectric film is patterned.

4. A method for manufacturing a piezoelectric film type actuator according to claim 1, wherein the surface roughness Ra of said piezoelectric film is 0.01 µm to 2.5 µm.

5. A method for manufacturing a piezoelectric film type actuator according to claim 1, wherein in the step of bonding the piezoelectric film and the oscillating plate structural member, said piezoelectric film and said oscillating plate structural member are bonded by means of energized heating, low temperature heating, or energized contact under pressure through single metal, alloy, metal oxide, metal nitride, or metallic compound.

6. A method for manufacturing a piezoelectric film type actuator according to claim 1, wherein in the step of peeling off the intermediate transfer member from the piezoelectric film, said intermediate transfer member is peeled off by the irradiation of laser beam from the intermediate transfer member side.

7. A method for manufacturing a piezoelectric film type actuator according to claim 6, wherein said laser beam is an excimer laser beam.

8. A method for manufacturing a piezoelectric film type actuator according to claim 6, wherein said laser beam is an infrared laser beam.

9. A method for manufacturing a piezoelectric film type actuator according to claim 7, wherein the transmissivity of 230 to 260 nm wavelength of said intermediate transfer member is 20% or more.

10. A method for manufacturing a piezoelectric film type actuator according to claim 8, wherein the transmissivity of 700 nm to 1,250 nm wavelength of said intermediate transfer member is 20% or more.

11. A method for manufacturing a piezoelectric film type actuator according to claim 1, wherein in the step of peeling off an intermediate transfer member from a piezoelectric film, a fluid flux is discharged between the intermediate transfer member and the piezoelectric film to peel off said intermediate transfer member.

12. A method for manufacturing a piezoelectric film type actuator according to claim 1, wherein said first precursor layer becomes a porous layer by said firing of said second precursor layer in said step (c).

13. A method for manufacturing a piezoelectric film type actuator according to claim 12, wherein said porous layer contains metal oxide.

14. A piezoelectric film type actuator manufactured by the method for manufacturing a piezoelectric film type actuator according to claim 1.

15. A method for manufacturing a liquid discharge head provided with a base plate portion having liquid discharge ports; liquid chambers connected with said liquid discharge ports; and a piezoelectric film type actuator formed by a piezoelectric film and an oscillating plate provided for a part of said liquid chambers, for discharging liquid from the liquid discharge ports by means of the flexural oscillation of said piezoelectric film type actuator, comprising in this order the following steps of:
    (a) forming a first precursor layer of a material capable of becoming porous upon a firing step on an intermediate transfer member;
    (b) forming a second precursor layer comprising a material of said piezoelectric film on said first precursor layer;
    (c) forming said piezoelectric film by firing said second precursor layer;
    (d) bonding the piezoelectric film to said oscillating plate structural member; and
    (e) peeling off said intermediate transfer member from said piezoelectric film.

16. A method for manufacturing a liquid discharge head according to claim 15, wherein said piezoelectric film contains lead, titanium, and zirconium.

17. A method for manufacturing a liquid discharge head according to claim 15, wherein said piezoelectric film is patterned.

18. A method for manufacturing a liquid discharge head according to claim 15, wherein the surface roughness Ra of said piezoelectric film is 0.01 µm to 2.5 µm.

19. A method for manufacturing a liquid discharge head according to claim 15, wherein in the step of bonding the piezoelectric film and the oscillating plate structural member, said piezoelectric film and said oscillating plate structural member are bonded by means of energized heating, low temperature heating, or energized contact under pressure through single metal, alloy, metal oxide, metal nitride, or metallic compound.

20. A method for manufacturing a liquid discharge head according to claim 15, wherein in the step of peeling off the intermediate transfer member from the piezoelectric film, said intermediate transfer member is peeled off by the irradiation of laser beam from the intermediate transfer member side.

21. A method for manufacturing a liquid discharge head according to claim 20, wherein said laser beam is excimer laser beam.

22. A method for manufacturing a liquid discharge head according to claim 20, wherein said laser beam is infrared laser beam.

23. A method for manufacturing a liquid discharge head according to claim 21, wherein the transmissivity of 230 to 260 nm wavelength of said intermediate transfer member is 20% or more.

24. A method for manufacturing a liquid discharge head according to claim 22, wherein the transmissivity of 700 nm to 1,250 nm wavelength of said intermediate transfer member is 20% or more.

25. A method for manufacturing a liquid discharge head according to claim 15, wherein in the step of peeling off an intermediate transfer member from a piezoelectric film, a fluid flux is discharged between the intermediate transfer member and the piezoelectric film to peel off said intermediate transfer member.

26. A method for manufacturing a liquid discharge head according to claim 15, wherein said first precursor layer becomes a porous layer by said firing of said second precursor layer in said step (c).

27. A method for manufacturing a liquid discharge head according to claim 26, wherein said porous layer contains metal oxide.

28. A liquid discharge head manufactured by the method for manufacturing a liquid discharge head according to claim 15.

29. A method for manufacturing a piezoelectric film type actuator having a piezoelectric film and an oscillating plate structural member bonded therefor comprising in this order the following steps of:

(a) forming a porous layer on an intermediate transfer member;

(b) forming a layer comprising said piezoelectric film on said porous layer;

(c) bonding the piezoelectric film to said oscillating plate structural member; and (d) peeling off said intermediate transfer member from said piezoelectric film.

30. A method for manufacturing a piezoelectric film type actuator according to claim 29, wherein in the step of peeling off an intermediate transfer member from piezoelectric film, a fluid flux is discharged between the intermediate transfer member and the piezoelectric film to peel off said intermediate transfer member.

31. A method for manufacturing a liquid discharge head provided with a base plate portion having liquid discharge ports; liquid chambers connected with said liquid discharge ports; and a piezoelectric film type actuator formed by a piezoelectric film and an oscillating plate provided for a part of said liquid chambers, for discharging liquid from the liquid discharge ports by means of the flexural oscillation of said piezoelectric film type actuator, the method comprising in this order the steps of:

(a) forming a porous layer on an intermediate transfer member;

(b) forming a layer comprising said piezoelectric film on said porous layer;

(c) bonding the piezoelectric film to said oscillating plate structural member; and (d) peeling off said intermediate transfer member from said piezoelectric film.

32. A method for manufacturing a piezoelectric film type actuator having a piezoelectric film and an oscillating plate structural member joined therefor, comprising, in this order, the following steps of:

(a) forming a porous layer on an intermediate transfer member;

(b) forming a layer comprising said piezoelectric film on said porous layer;

(c) joining the piezoelectric film and said oscillating plate structural member; and (d) removing said intermediate transfer member from said piezoelectric film.

33. A method for manufacturing a liquid discharge head provided with a base plate portion having liquid discharge ports; liquid chambers communicating with said liquid discharge ports; and a piezoelectric film type actuator formed by a piezoelectric film and an oscillating plate provided for a part of said liquid chambers, for discharging liquid from the liquid discharge ports by means of the flexural oscillation of said piezoelectric film type actuator, the method comprising, in this order, the steps of:

(a) forming a porous layer on an intermediate transfer member;

(b) forming a layer comprising said piezoelectric film on said porous layer;

(c) joining the piezoelectric film and said oscillating plate structural member; and (d) removing said intermediate transfer member from said piezoelectric film.

* * * * *

UNITED STATES PATENT AND TRADEMARK OFFICE
CERTIFICATE OF CORRECTION

PATENT NO.   : 6,911,107 B2
DATED        : June 28, 2005
INVENTOR(S)  : Yutaka Kagawa et al.

It is certified that error appears in the above-identified patent and that said Letters Patent is hereby corrected as shown below:

Column 2,
Line 27, "piezoelectric," should read -- piezoelectric film type actuator, --; and
Line 31, "beating," should read -- heating, --.

Column 11,
Line 45, "allay" should read -- alloy --.

Signed and Sealed this

Eighth Day of November, 2005

JON W. DUDAS
*Director of the United States Patent and Trademark Office*